(12) United States Patent
Chambers

(10) Patent No.: US 7,202,701 B1
(45) Date of Patent: Apr. 10, 2007

(54) INPUT/OUTPUT CIRCUIT FOR HANDLING UNCONNECTED I/O PADS

(75) Inventor: Peter Chambers, Phoenix, AZ (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/295,260

(22) Filed: Dec. 6, 2005

(51) Int. Cl.
*H03K 19/0175* (2006.01)
*G06F 17/50* (2006.01)

(52) U.S. Cl. .......................... 326/82; 326/86; 326/38; 326/39; 326/41

(58) Field of Classification Search .................. 326/56, 326/57, 58, 82, 86
See application file for complete search history.

(56) References Cited

U.S. PATENT DOCUMENTS

| | | | | |
|---|---|---|---|---|
| 6,020,757 A | * | 2/2000 | Jenkins, IV | 326/39 |
| 6,072,728 A | * | 6/2000 | Merritt | 365/189.05 |
| 6,577,157 B1 | * | 6/2003 | Cheung et al. | 326/38 |
| 6,677,781 B2 | * | 1/2004 | Ishikawa et al. | 326/82 |
| 2003/0107908 A1 | * | 6/2003 | Jang et al. | 365/51 |

* cited by examiner

*Primary Examiner*—Tarifur Chowdhury
*Assistant Examiner*—Mohammad A. Latif
(74) *Attorney, Agent, or Firm*—Patent Law Group LLP; Carmen C. Cook

(57) ABSTRACT

A circuit coupled to an input-output bond pad (I/O pad) in an integrated circuit including an input buffer, an output buffer and a pad management circuit. The pad management circuit receives a first data signal, a first output enable signal, and a configuration signal indicative of the connection state of the I/O pad, and generates a second data signal and a second output enable signal. When the configuration signal indicates the I/O pad is to be connected to a package pin, the pad management circuit couples the first data signal as the second data signal and couples the first output enable signal as the second output enable signal. When the configuration signal indicates the I/O pad is to be left unconnected, the pad management circuit asserts the second output enable signal and generates the second data signal having a predetermined value.

8 Claims, 3 Drawing Sheets

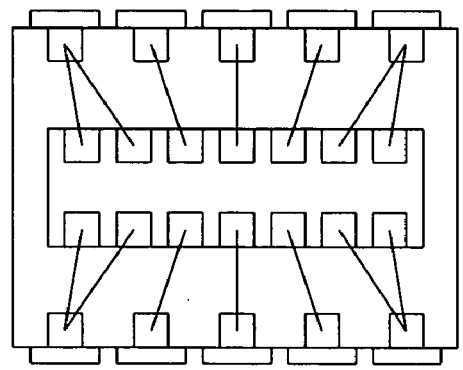
Figure 3
(Prior Art)
Figure 4
(Prior Art)
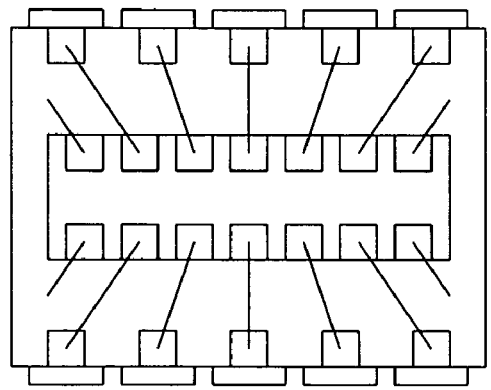
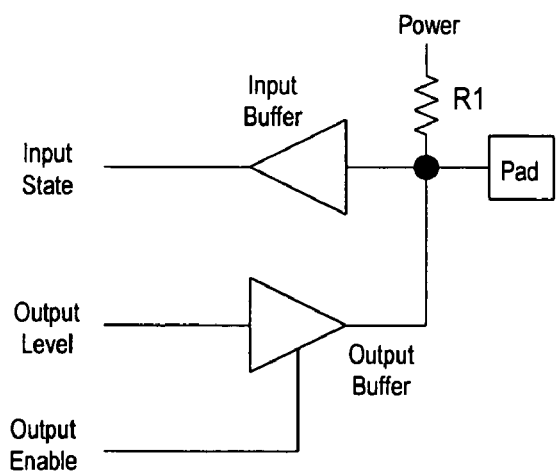
Figure 5
(Prior Art)

INPUT/OUTPUT CIRCUIT FOR HANDLING UNCONNECTED I/O PADS

FIELD OF THE INVENTION

The invention relates to input/output circuitry for an integrated circuit I/O pad and, in particular, to an input/output circuit for handling and managing I/O pads that are non-connected in an integrated circuit package.

DESCRIPTION OF THE RELATED ART

Integrated circuit chips (IC chips) or semiconductor die are typically encapsulated in a package to provide a housing for the die and to protect the circuitry formed on the semiconductor die from external elements. A semiconductor die includes bond pads formed thereon and bond wires, or other electrical connection means, are used to electrically connect the bond pads to corresponding pins or leads of the integrated circuit package. The bond pads can be power pads for power supply voltages (such as Vdd and Vss/ground) connections and input/output (I/O) pads for connecting to input and output signals of the integrated circuit. In most cases, a package is selected for a semiconductor die having sufficient number of package pins for connecting to the bonds pads of the die. It is instructive to note that in some applications multiple bond pads for the power connections of the die are connected to a single package lead. However, a bond pad carrying an input or output signal (an I/O pad) is generally bonded only to a single package lead.

In some cases, a semiconductor die may be placed in a package with fewer package pins than the number of I/O pads. In that case, some of the I/O pads will be left unconnected. FIG. 1 is a sectional view of a semiconductor chip assembly including a semiconductor package (10) housing a semiconductor die (12). In the present illustration, semiconductor package 10 has ten package pins (denoted by dotted circle 14) while semiconductor die 12 has fourteen bond pads 16. When the extra or unbonded bond pads are purely output pads, the unconnected state does not present a problem. However, when the unbonded bond pads are input pads or input-output pads, leaving the bond pads unconnected may be undesirable.

FIG. 2 is a circuit diagram of a conventional "full" I/O pad design where the I/O pad is provided with an I/O circuit suitable for both input and output functions. Specifically, to support the input function, I/O pad 16 is connected to an input buffer 18. Input voltage levels applied to pad 16 are buffered by input buffer 18 to be coupled to internal circuitry of the integrated circuit as the "input state" signal. On the other hand, to support the output function, an output buffer 20 is coupled to drive I/O pad 16. Output buffer 20 receives electrical signals ("output level") which are driven onto pad 16 when the output enable signal is asserted.

In any I/O pad circuit, an input buffer driven by an external signal remains stable and well-behaved. However, an input buffer that is left undriven is unpredictable. The voltage level at the input terminal of the input buffer tends to "float" (typically between the positive power supply voltage and the ground voltage), and the floating voltage level at the input buffer may cause the buffer to oscillate wildly. When the input buffer floats and oscillates, power consumption often increases dramatically.

Thus, an unconnected I/O pad in a semiconductor package is not desirable. Conventional solutions to the problem include bonding a package pin to multiple I/O pads, as shown in FIG. 3. Thus, an "extra" I/O pad is connected to a package pin already assigned to another I/O pad. This solution ensures that all input pads are driven but requires that the "extra" I/O pad that shares a pin connection be able to accept the same signals at the same time as its "partner" pad. Such a constraint is very difficult to meet at the system level (or the operation level) and the solution is therefore generally unacceptable.

Another conventional solution to unconnected I/O pads in a package is to down-bond the unused I/O pads to the die paddle which is usually electrically grounded, as shown in FIG. 4. However, this method only works if ground connections are acceptable for the unused I/O pads. Even if the unused pads can be electrically connected to ground, down-bonding is awkward and expensive, especially in very small packages. As semiconductor packaging trend shifts towards smaller packages, down-bonding is no longer a feasible option.

Lastly, the conventional solution also includes using an on-chip termination resistor at each I/O pad, as shown in FIG. 5. In this manner, the input pad, when not driven, is biased to the Vdd power supply (as shown in FIG. 5) or to ground (by connecting the termination resistor to the ground voltage). Again, this solution requires that the integrated circuit operates correctly when the unconnected I/O pads are permanently connected high or low. Another significant drawback of this method is that when the I/O pad is connected to a package pin for normal operation, significant current consumption results when the I/O pad is driven to a voltage level opposite to the self-biased voltage level provided by the termination resistor. The large current consumption due to the use of a termination resistor at each I/O pad renders this solution unacceptable in most applications.

SUMMARY OF THE INVENTION

According to one embodiment of the present invention, a circuit coupled to an input-output bond pad (I/O pad) in an integrated circuit including an input buffer, an output buffer and a pad management circuit. The input buffer has an input terminal coupled to the I/O pad, and an output terminal providing an input data value for the integrated circuit. The output buffer has a data input terminal coupled to receive a first data signal, an output enable terminal coupled to receive a first output enable signal, and an output terminal coupled to the I/O pad. The output buffer drives the I/O pad to a voltage level corresponding to the first data signal when the first output enable signal is asserted. The pad management circuit has a first input terminal receiving a second data signal, a second input terminal receiving a second output enable signal, and a third input terminal receiving a configuration signal indicative of the connection state of the I/O pad. The pad management circuit generates the first data signal and the first output enable signal.

In operation, the configuration signal has a first value indicating a normal mode where the I/O pad is to be connected to a package pin in an integrated circuit package and the configuration signal has a second value indicating an unconnected mode where the I/O pad is to be left unconnected in the integrated circuit package. When the configuration signal has the first value, the pad management circuit couples the second data signal as the first data signal and couples the second output enable signal as the first output enable signal. When the configuration signal has the second value, the pad management circuit asserts the first output enable signal and generates the first data signal having a predetermined value.

According to another aspect of the present invention, a method for an input-output bond pad (I/O pad) in an integrated circuit, where the I/O pad is coupled to an I/O circuit including an input buffer and an output buffer, includes determining the connection state of the I/O pad; when the connection state indicates an unconnected mode where the I/O pad is to be left unconnected in an integrated circuit package, activating the output buffer and driving the I/O pad to a first data value; and when the connection state indicates a normal mode where the I/O pad is to be connected in the integrated circuit package, driving the I/O pad in accordance with the normal operation of the integrated circuit.

The present invention is better understood upon consideration of the detailed description below and the accompanying drawings.

BRIEF DESCRIPTION OF THE DRAWINGS

FIG. 3 is a sectional view of a conventional semiconductor chip assembly illustrating multiple bonds connected to a single lead.

FIG. 4 is a sectional view of a conventional semiconductor chip assembly illustrating down-bonding of unconnected I/O pads.

FIG. 5 is a circuit diagram of a conventional "full" I/O pad design including a termination resistor.

DETAILED DESCRIPTION OF THE PREFERRED EMBODIMENTS

Figure 1:
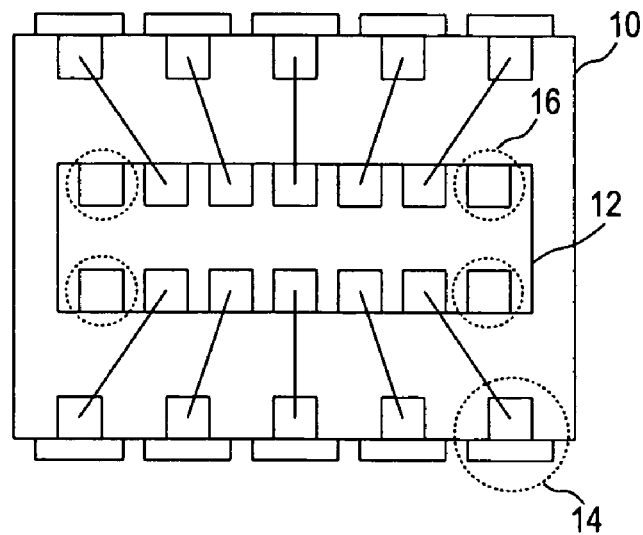
FIG. 1 is a sectional view of a semiconductor chip assembly including a semiconductor package (10) housing a semiconductor die (12).
Figure 2:
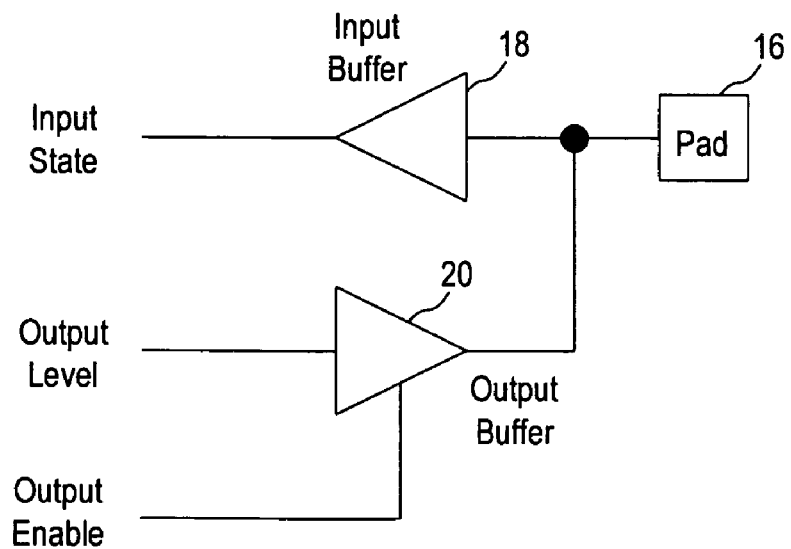
FIG. 2 is a circuit diagram of a conventional "full" I/O pad design where the I/O pad is provided with an I/O circuit suitable for both input and output functions.

In accordance with the principles of the present invention, an input/output (I/O) circuit coupled to a bond pad on an integrated circuit (IC) is configured to operate in a normal mode or in an unconnected mode in accordance with the configuration information of the integrated circuit whereby an input/output (I/O) pad that is to be left unconnected in a package is driven to a predetermined state that is compatible with the operation of the integrated circuit. In this manner, any I/O pads that are to be left unconnected in an integrated circuit package are not left floating but rather are properly driven to ensure desired circuit functionality and low power consumption.

In certain electronic applications, it is desirable to build a family of IC products from a single silicon die design. The behavior of the silicon die can be selected using trim options. Furthermore, the silicon die may be assembled into different packages depending on the requirements of the application. In some situations, such as when cost or device size is critical, the silicon die may be mounted into a package with a smaller number of package pins than the number of I/O pads on the silicon die. In that case, there will be I/O pads on the silicon die that are not connected to any pins of the package. The input buffers of the unconnected I/O pads are then left floating and may cause oscillation, electrical noise, excessive current consumption and other problems as discussed above.

A key advantage of the I/O circuit of the present invention is that the I/O circuit enables a single silicon die to be assembled in multiple packages, including packages with fewer package pins than the I/O pads on the die. When the silicon die incorporates the I/O circuit of the present invention in the I/O pads, an I/O pad can be left unbonded without adverse effect. The unconnected I/O pads are properly driven to a predetermined state so that the problems associated with a floating I/O pad are eliminated and the operation of the integrated circuit is not affected. The I/O circuit of the present invention realizes significant advantages over prior art solutions. First, the cost of the bond wires is reduced by eliminating the need for double bonding or down-bonding. Also, manufacturing cost is reduced and reliability is enhanced when down-bonding is not used. Lastly, power consumption is reduced by eliminating the termination resistor.

In the present description, the term "I/O pad" refers to a bond pad on a silicon die that supports input, output, or input and output functions. A silicon die includes bond pads that are I/O pads and bond pads that are power pads for receiving the positive and negative (Vdd, Vss or Ground) power supply voltages. Furthermore, an I/O pad is coupled to an I/O circuit to implement the input, output, or input and output functions for the I/O pad. In the present description, the term "input/output" or "I/O" refers to input, output or input-output functions. The I/O circuit of the present invention is applicable in I/O pads that support input functions and input-output functions. When an I/O pad is configured as an output pad only, leaving the output pad unconnected or undriven in a package does not result in the aforementioned problems that are associated with a floating input buffer. Therefore, the I/O circuit of the present invention is not strictly necessary for a pad that supports output function only.

Moreover, in the present description, the I/O pads are digital I/O pads. However, the I/O circuit of the present invention is also applicable to analog I/O pads.

Figure 6:
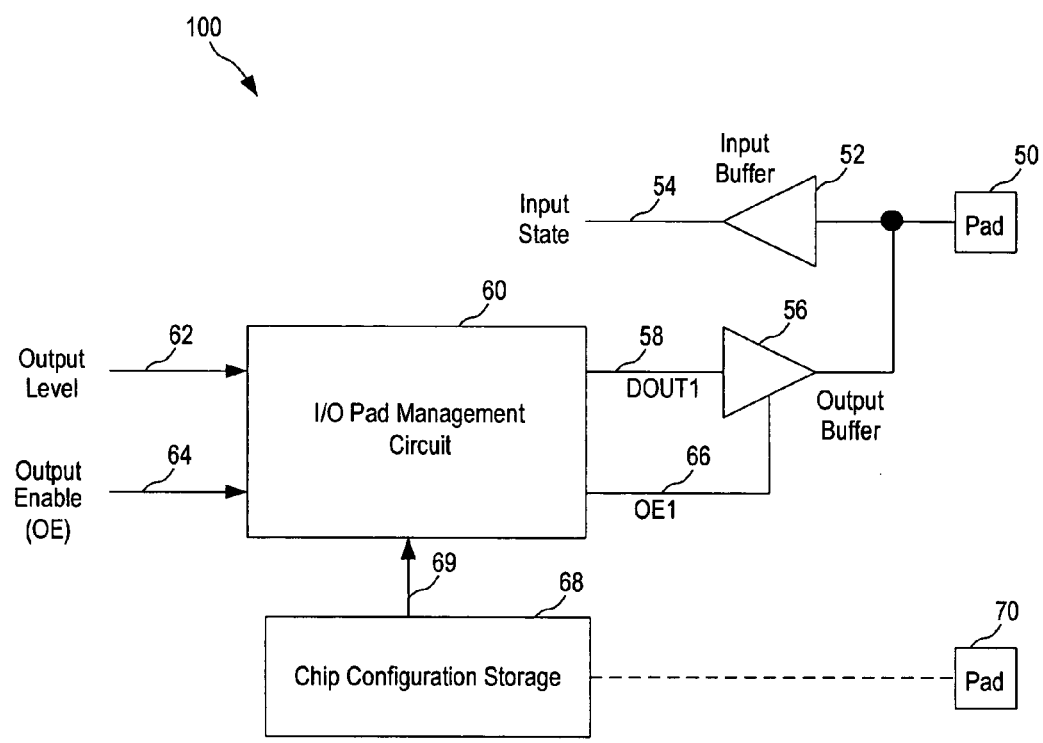
FIG. 6 is a schematic diagram of an I/O circuit for handling unconnected I/O pads according to one embodiment of the present invention.

FIG. 6 is a schematic diagram of an I/O circuit for handling unconnected I/O pads according to one embodiment of the present invention. Referring to FIG. 6, an I/O circuit 100 includes an input buffer 52 coupled to receive an input signal from an I/O pad 50 and driving the input signal onto an output node 54 where the input signal is provided as an input state to the internal circuitry of the integrated circuit. I/O circuit 100 also includes an output buffer 56 coupled to drive I/O pad 50. Output buffer 56 receives an output data signal DOUT1 on an input terminal 58 and an output enable signal OE1 on a control terminal 66. When the output enable signal OE1 is not asserted, output buffer 56 is in a tri-state mode and does not drive I/O pad 50. When the output enable signal OE1 is asserted, output buffer 56 drives I/O pad 50 to the logical state corresponding to the output data signal DOUT1.

I/O circuit 100 includes a chip configuration storage 68 and an I/O pad management circuit 60. Chip configuration storage 68 stores information relating to the device configuration of the integrated circuit implemented on the silicon die. Chip configuration storage 68 also stores packaging information for the silicon die. Based on the device configuration information and packaging information, I/O circuit 100 can determine whether the associated I/O pad will be used in its normal mode, thus connected to a package pin, or will be left unconnected in the package and therefore requires special handling to ensure correct device operation.

In one embodiment, chip configuration storage 68 is implemented as a memory device such as a RAM, PROM or EEPROM. Chip configuration storage 68 can also be fuses or anti-fuses commonly used to store programming information of the silicon die. Alternately, chip configuration storage 68 can store device configuration and package programming information received on an I/O pad, such as I/O pad 70. That is, the device configuration and package selection information for the silicon die can be provided on-chip or off-chip. Although chip configuration storage 68 is shown as a stand-alone element in I/O circuit 100, chip configuration storage 68 can be implemented using memory devices (RAM, PROM or EEPROM) that are already in existence on the silicon chip and storage 68 does not need to be a separate stand-alone storage element. By using existing memory devices on the silicon die, the chip configuration storage element of I/O circuit 100 can be realized at no additional cost.

Chip configuration storage 68 provides device configuration and package information to I/O pad management circuit 60 on an input terminal 69. I/O pad management circuit 60 receives electrical signals ("output level") as output data signals on an input terminal 62 and an output enable signal (OE) on an input terminal 64. Output data signals (output level) on terminal 62 and output enable signal OE on terminal 64 represent signals that are to be applied when pad 50 is in the normal mode where pad 50 is connected in a package.

Based on the device configuration and package information provided by chip configuration storage 68, I/O pad management circuit 60 operates in one of two modes. In the normal mode, the device configuration and package information indicates that pad 50 is to be connected to a package pin and will be used in its normal operation. Thus, I/O pad management circuit 60 allows the data output signal and output enable signal OE provided on terminals 62 and 64 to pass through as output data signals DOUT1 and output enable signal OE1 on terminals 58 and 66. Essentially, when I/O circuit 100 is in its normal mode, I/O pad management circuit 60 is transparent to the operation of the integrated circuit implemented on the silicon die.

However, I/O pad management circuit 60 can also be operated in an unconnected mode when the device configuration and package information indicates that I/O pad 50 is to be left unconnected in an integrated circuit package. In the unconnected mode, I/O pad management circuit 60 overrides control of the I/O pad's output level and output enable OE signal. In operation, I/O pad management circuit 60 asserts the output enable OE1 signal to turn output buffer 56 on. Then I/O pad management circuit 60 provides an output data value as signal DOUT1 for output buffer 56 so that output buffer 56 drives pad 50 to a predetermined state. The output data value driven onto I/O pad 50 is selected to ensure that the output data value, when driven as the input state through the input buffer 52, has a value that is compatible with proper system operation for the integrated circuit. The output data value provided as signal DOUT1 is also selected to minimize power consumption.

As thus operated, in the unconnected mode, I/O circuit 100 uses the output buffer of the I/O pad to drive the input buffer of the same I/O pad. Thus, in the unconnected mode, the input buffer of pad 50 is driven to a known, stable state. The output data value provided by I/O pad management circuit 60 in the unconnected mode can be a static value or it can change depending on system operation. The only requirement for the output data value in the unconnected mode is that the input state resulted therefrom is compatible with the system operation and does not adversely impact system functionality.

In one embodiment, I/O pad management circuit 60 is implemented using multiplexers. Other circuit configuration for I/O pad management circuit 60 is possible.

By using the I/O circuit in accordance with the present invention, a single silicon die can be assembled in different packages with different number of package pins. The I/O circuit can be applied to allow I/O pads on the silicon die to be left unconnected. The I/O circuit of the present invention eliminates the needs for peculiar bond wire configurations or on-chip termination resistors to handle the unconnected I/O pads. Also, the I/O circuit of the present invention is able to keep power consumption contributed by the unconnected I/O pads to an absolute minimum. The I/O circuit is also cost effective and simple to implement and realizes advantages not achievable by the conventional solutions.

The above detailed descriptions are provided to illustrate specific embodiments of the present invention and are not intended to be limiting. Numerous modifications and variations within the scope of the present invention are possible. The present invention is defined by the appended claims.

I claim:

1. A circuit coupled to an input-output bond pad (I/O pad) in an integrated circuit, the circuit comprising:
   an input buffer having an input terminal coupled to the I/O pad, an output terminal providing an input data value for the integrated circuit;
   an output buffer having a data input terminal coupled to receive a first data signal, an output enable terminal coupled to receive a first output enable signal, and an output terminal coupled to the I/O pad, the output buffer driving the I/O pad to a voltage level corresponding to the first data signal when the first output enable signal is asserted;
   a pad management circuit having a first input terminal receiving a second data signal, a second input terminal receiving a second output enable signal, and a third input terminal receiving a configuration signal indicative of the connection state of the I/O pad, the pad management circuit generating the first data signal and the first output enable signal,
   wherein the configuration signal has a first value indicating a normal mode where the I/O pad is to be connected to a package pin in an integrated circuit package and the configuration signal has a second value indicating an unconnected mode where the I/O pad is to be left unconnected in the integrated circuit package; and
   wherein when the configuration signal has the first value, the pad management circuit couples the second data signal as the first data signal and couples the second output enable signal as the first output enable signal; and when the configuration signal has the second value, the pad management circuit asserts the first output enable signal and generates the first data signal having a predetermined value.

2. The circuit of claim 1, wherein in the unconnected mode, the pad management circuit generates the first data signal having a predetermined value that is compatible with the operation of the integrated circuit.

3. The circuit of claim 2, wherein the predetermined value of the first data signal comprises a fixed data value.

4. The circuit of claim 2, wherein the predetermined value of the first data signal comprises a data value that varies according to the operation of the integrated circuit.

5. The circuit of claim 1, wherein the predetermined value of the first data signal is driven to the output terminal of the input buffer through the I/O pad.

6. The circuit of claim 1, further comprising:
a memory device storing the configuration information of the integrated circuit and providing the configuration information to the pad management circuit.

7. The circuit of claim 6, wherein the memory device comprises one of a RAM, a PROM, an EEPROM, fuses and anti-fuses.

8. The circuit of claim 6, wherein the memory device comprises a memory element coupled to a second I/O pad for receiving the configuration information from the second I/O pad.

* * * * *